United States Patent [19]
Ohta

[11] Patent Number: 5,343,182
[45] Date of Patent: Aug. 30, 1994

[54] MAGNET DEVICE FOR GENERATING STATIC MAGNETIC FIELD IN MRI

[75] Inventor: Tadatoshi Ohta, Tachikawa, Japan

[73] Assignee: Kabushiki Kaisha Toshiba, Kawasaki, Japan

[21] Appl. No.: 824,504

[22] Filed: Jan. 23, 1992

[30] Foreign Application Priority Data

Jan. 23, 1991 [JP] Japan ................. 3-006486

[51] Int. Cl.$^5$ .................. H01F 5/00; H01F 7/22
[52] U.S. Cl. .................. 335/299; 335/216; 324/319
[58] Field of Search .......... 335/216, 296–306; 324/318–320

[56] References Cited

U.S. PATENT DOCUMENTS

| | | | |
|---|---|---|---|
| 4,385,277 | 5/1983 | Hanley | 324/309 |
| 4,506,247 | 3/1985 | Vermilyea . | |
| 4,587,504 | 5/1986 | Brown et al. | 335/216 |
| 4,701,736 | 10/1987 | McDougall et al. | 335/299 |
| 4,724,412 | 2/1988 | Kalafala | 335/299 |
| 4,890,082 | 12/1989 | Fujita | 335/301 |
| 5,012,217 | 4/1991 | Palkovich | 335/301 |
| 5,045,826 | 9/1991 | Laskaris | 335/301 |
| 5,136,273 | 8/1992 | Ohta | 335/301 |
| 5,168,211 | 12/1992 | Laukien et al. | 324/319 |
| 5,210,512 | 5/1993 | Davies | 335/216 |
| 5,245,306 | 9/1993 | Overweg | 335/299 |
| 5,276,399 | 1/1994 | Kasten et al. | 324/319 |

FOREIGN PATENT DOCUMENTS

| | | |
|---|---|---|
| 0167243 | 1/1986 | European Pat. Off. . |
| 0236789 | 9/1987 | European Pat. Off. . |
| 0251342 | 1/1988 | European Pat. Off. . |
| 0424600 | 5/1991 | European Pat. Off. . |
| 3829175 | 3/1989 | Fed. Rep. of Germany . |
| 62-293704 | 12/1987 | Japan . |
| 63-260116 | 10/1988 | Japan . |
| 1-227407 | 9/1989 | Japan . |
| 2-106905 | 4/1990 | Japan . |

*Primary Examiner*—Leo P. Picard
*Assistant Examiner*—R. Barrera
*Attorney, Agent, or Firm*—Oblon, Spivak, McClelland, Maier & Neustadt

[57] ABSTRACT

A magnet device for MRI system is provided with a main coil assembly including a plurality of ring-like main coils wound around a reel element and a sub-coil assembly including at least one pair of ring-like sub-coils wound around the reel element. All the coils are arranged symmetric with respect to an axial direction of the reel element. The sub-coils are disposed at axially inner predetermined positions apart from the axial outermost main coils. A coil driving element, provided in the device, makes the main coils generate a main magnetic field in the space and makes the sub-coils generate a magnetic field inverse to the main magnetic field to form a high-uniform static magnetic field as a diagnostic space. Magnetomotive forces of the main coils and sub-coils are adjusted so that the diagnostic space having a longer radial axis than its longitudinal axis is formed in the cylindrical space.

9 Claims, 7 Drawing Sheets

| COILS | MAGNETOMOTIVE FORCE (AT) |
|---|---|
| L1a | 174420 |
| Sa | −26460 |
| Lc | 231120 |
| Sb | −26460 |
| L1b | 174420 |

MAGNET DEVICE FOR GENERATING STATIC MAGNETIC FIELD IN MRI

BACKGROUND OF THE INVENTION

The present invention relates to a magnet device for generating a static magnetic field in magnetic resonance imaging (MRI), and more particularly to the magnet device, provided with a main coil assembly and a sub-coil assembly for shimming the static magnetic field created by the main coil assembly, which generates a horizontal magnetic field in which magnetic lines of force pass along a patient's body axis.

In magnetic resonance imaging, there is provided a magnet device for generating a static magnetic field, whereby atomic nuclei of a patient body align themselves with the static field. For high resolution and non-distortion of images produced, a static magnetic field is needed, as one of the requirements for MRI, so as to have a highly uniform magnetic field providing a practical diagnostic space. The diagnostic space having high uniformity of magnetic flux can be accomplished by adopting shim coils.

U.S. Pat. No.4,506,247 discloses even and odd pairs of axisymmetric correction coils (i.e. a shim coil assembly) disposed on a cylindrical coil form at specified longitudinal positions without overlap. The purpose of these coil pairs is to provide a correction field for a magnet employed in MRI systems. The correction is given by selecting properly the locations of the coils on the cylindrical coil form which is disposed coaxially with a main magnet device such as a permanent magnet device or a superconducting magnet device.

However, applying the above correction coil system to a main magnet device will result in an increase of the size in the radial direction of the device, because the cylindrical coil form must be installed, separately from and coaxially with the main magnet. Moreover, assembling of the whole magnet device would be cumbersome. Further, two power units for the main coils and correction coils are needed.

Japanese Patent Laid open No. 62-293704 also discloses a shimming mechanism for a vertical magnetic field in which magnetic lines of force pass through a patient's body from his front to his back or vice-versa. The above shimming mechanism adopts at least one pair of ring-like sub-coils, which is disposed, together with main coils producing a main magnetic field, within a fixed angle range with respect to the central point of the static magnetic field. The sub-coils are to receive electric current permitting them to generate a magnetic field opposite to the main magnetic field in order to acquire a uniformity of the diagnostic space.

Even in the magnet device generating the horizontal magnetic field, it is desirable to create a large diagnostic space which necessarily leads to a far distance between the coils of a main coil pair. Since, when the device of generating the horizontal magnetic field utilizes the above shimming mechanism, the device will be increased in size in the axial direction, because the sub-coils must exist in the main coil assembly. Besides, accommodating the main coils and sub-coils within the predetermined angle region with respect to the central point will result in a bulky size in its radial direction.

It is also required for the magnet device to provide a large diagnostic space having a high strength uniform magnetic field. A patient may be troubled with claustrophobia due to a small, tight diagnostic space during the examination. To avoid such discomfort, the size of the magnet device will have to be increased in both the axial and radial directions, which is undesirable. Especially, in a superconducting magnet device which is desirable for generating a high strength of magnetism, a high-strength, high-uniform spherical diagnostic space of 30 to 50 cm diameter would lead to a noticeably elongated axial form for keeping a less-error axial region as long as possible.

SUMMARY OF THE INVENTION

Accordingly, it is a primary object of the present invention to provide a magnet device which can be produced into a compact form in both the axial and radial directions and which can generate a uniform diagnostic space in a static magnetic field.

It is another object of the present invention to provide a magnet device generating a highly uniform diagnostic space large enough to avoid patient's discomfort.

It is further object of the present invention to provide a magnet device applicable at its best when the horizontal magnetic field is required as a main magnetic field.

It is a still further object of the present invention to provide a magnet device applied desirably to a superconducting magnet device.

These and other objects can be achieved according to the present invention, in one aspect by providing, a magnet device of a magnetic resonance imaging system which has a cylindrical space wherein a central point is determined in axial and radial directions of the cylindrical space and which generates a static magnetic field in the cylindrical space, said magnet device comprising a reel element for forming said cylindrical space therein; a main coil assembly including a plurality of ring-like main coils wound around said reel element at axial positions of the reel element, the axial positions being symmetric with respect to said central point; a sub-coil assembly including at least one pair of ring-like sub-coils wound around said reel element; and a coil driving element for giving said main coils magnetomotive forces to make the main coils generate a main magnetic field along a predetermined axial direction in said cylindrical space and for giving said sub-coils magnetomotive forces to make the sub-coils generate a magnetic field opposite to the main magnetic field, wherein said sub-coils are wound around said reel element at axial positions of the reel element, the axial positions being at axially inner positions in said main coil assembly.

Preferably, said sub-coils are disposed so as to suppress high order components of a series expansion for an axial component of said main magnetic field in the cylindrical space.

It is preferred that said main coil assembly comprises three or more main coils and said sub-coil assembly comprises one pair of sub-coils, and said sub-coils are each disposed next to axial outermost main coils of the main coil assembly.

It is also preferred that said main coil assembly comprises five or more main coils and said sub-coil assembly comprises two pairs of sub-coils, and one pair of said two pairs of sub-coils are each disposed between first axial outer main coils and second axial outer main coils of the main coil assembly and another pair of said two pairs of sub-coils are each disposed between the first axial outer main coils and third axial outer main coils of the main coil assembly.

The location of sub-coils into the main coil assembly can cancel error components of the main magnetic field for the magnet device having axially and radially reduced lengths. As a result, the magnet device can be made into an axially compact form, generating a highly uniform magnetic field as a diagnostic space.

It is also preferred that all of said main coils and sub-coils are electrically connected in series, said sub-coils being wound oppositely from the main coils. Said coil driving element comprises one electric power source, the electric power source being electrically connected in series to all of the main coils and sub-coils.

As a result, only one electric power source is required to drive the magnet device, leading to its simplified construction as a whole.

It is also preferred that the magnet device be applied to a superconducting magnet device provided with a liquid helium container having an inner cylindrical wall portion which serves as said reel element. Said main coils and sub-coils are wound around the inner cylindrical wall portion, the main coils and sub-coils being activated as superconducting coils therein. Thus, it is possible to make the superconducting magnet device compact with a highly uniform diagnostic space therein.

In a further aspect according the present invention, there is provided a magnet device of a magnetic resonance imaging system, further, wherein said axial positions and magnetomotive forces of the main coils and sub-coils are adjusted so as to form a uniform static magnetic field produced together by the main coils and sub-coils as a diagnostic space into a shape in which an axis extending in said radial direction is longer than an axis extending in said axial direction. Further, said diagnostic space is formed into an ellipsoidal shape in section or an ellipsoidal shape in section having partially distorted portions.

As a result, in addition to magnetic uniformity of the diagnostic space, the magnet device can make the diagnostic space so that the space is able to give a patient a feeling of increased space which will thereby relax the patient.

BRIEF DESCRIPTIONS OF THE DRAWINGS

The accompanying drawings which are incorporated in and constitute a part of this specification, illustrate embodiments of the present invention and, together with the description, serve to explain the principles of the present invention; in which.

DESCRIPTION OF THE PREFERRED EMBODIMENTS

A first embodiment of a magnet device in accordance with the present invention will now be described with reference to FIG. 1 to FIG. 4C. In this embodiment, the magnet device is constructed as a superconducting magnet device.

Figure 1:
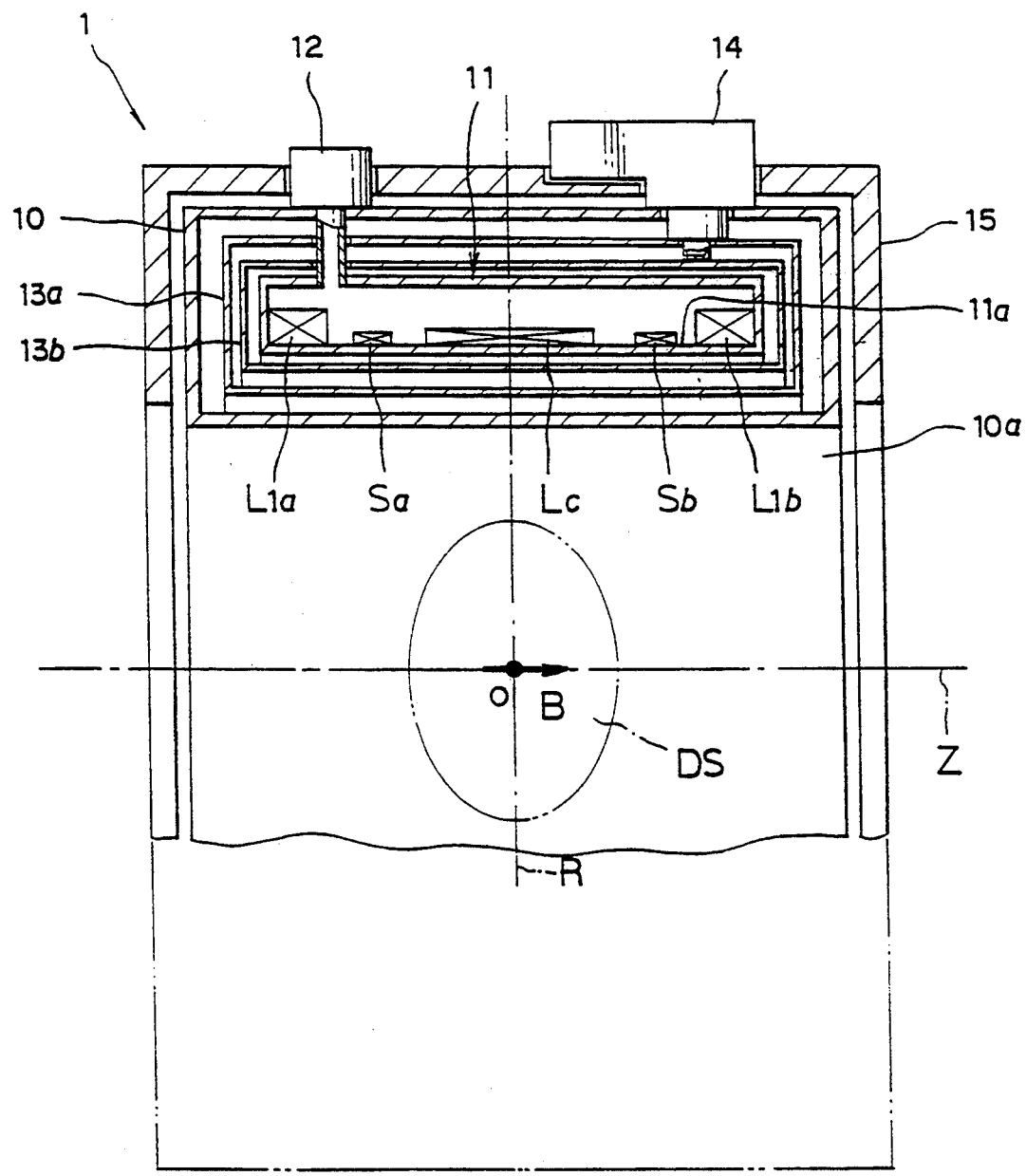
FIG. 1 is an axially-cut sectional view of an upper half part of a superconducting magnet device, in which main and sub-coil assemblies are incorporated, according to a first embodiment of the present invention.

FIG. 1 is an axial sectional view of a superconducting magnet device 1 used in a known MRI system. The superconducting magnet device 1 shown in FIG. 1 is provided with a vacuum vessel 10. The vacuum vessel 10 is formed as a cylinder having a predetermined length in the radial direction and length in axial direction and having a cylindrical bore 10a through which an axis Z can be set at the longitudinal center of the bore 10a. The bore 10a opens for placement of a patient, then the Z axis represents the patient's body axis passing from head to toe. The magnet device 1 may provide a horizontal static magnetic field for the patient.

The vacuum vessel 10 has a liquid helium container 11 coaxially disposed inside the vessel 10.

The liquid helium container 11, made of stainless steel, is also constructed into a cylindrical form having predetermined radial and axial lengths. The liquid helium container 11 is connected to a port 12 through which liquid helium can be supplied.

A double-walled heat shield composed of thermal shield plates 13a and 13b is disposed between the liquid helium container 11 and the vacuum vessel 10. The thermal shield plates 13a and 13b are cooled by a compact refrigerator 14 so as to minimize evaporation of the liquid helium. A magnetic shield 15 for reducing any environmental influence of the magnetic field generated by the device 1 is disposed outside the vacuum vessel 10.

The liquid helium container 11 has main coils L1a, Lc and L1b and sub-coils Sa and Sb individually wound around the inner surface of the inside wall 11a of the container 11, predetermined distances apart in the axial direction from one another. The inside wall 11a serves as a reel means of the present invention. All the main coils L1a, Lc and L1b constitute a main coil assembly and the two sub-coils Sa and Sb constitute a sub-coil assembly. In addition, all of the main and sub coils mentioned above are positioned so as to be symmetrical with respect to both the axis Z and an imaginary midplane R perpendicular to the axis Z at the center 0 (i.e. Z=0: origin) of this coil system.

The sub-coils Sa and Sb are disposed at axially inner positions which are next to the axial outermost main coils L1a and L1b, respectively. Namely, the sub-coil Sa is disposed at a predetermined position between the main coils L1a and Lc in FIG. 1, while the sub-coil Sb is disposed at a predetermined position between the main coils L1b and Lc in FIG. 1.

Each of the main and sub-coils L1a, Lc, L1b, Sa and Sb is made from superconducting material such as an alloy of Nb3 Sn or Nb—Ti.

Figure 2:
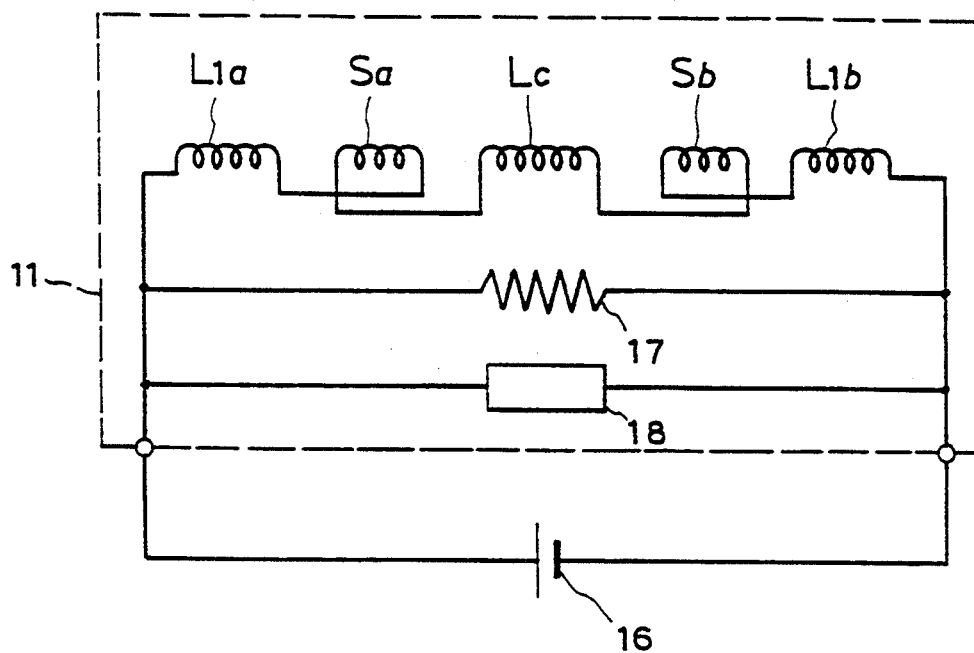
FIG. 2 is a circuit diagram showing a manner in which the coil assemblies shown in FIG. 1 are connected.

FIG. 2 shows an electrical circuit of the superconducting magnet device 1 shown in FIG. 1. All the coils including the main coils L1a, Lc and L1b and sub-coils Sa and Sb are connected in series in the liquid helium container 11. However, the connecting direction of the sub-coils Sa and Sb is opposite from the main coils L1a, Lc, and L1b. All of the series-connected coils are then connected to a DC power supply 16. Accordingly, the direction of electric current passing through the sub-coils Sa and Sb are set to be opposite against that of the main coils L1a, Lc and L1b.

In the liquid helium container 11, there is provided a protective resistance 17 and a permanent current switch 18, both of which are parallel connected to the series-connected coils. The DC power supply 16 can be disconnected by the permanent current switch 18 after all of the coils are set to a permanent current state. The protective resistance 17 can absorb energy generated when the superconducting coils, that is, L1a, Lc, L1b, Sa and Sb are quenched into an ordinary conductive state.

The reason why the sub-coils Sa and Sb should be disposed inside the main coil assembly will now be explained with reference to FIGS. 3 and 4A to 4C.

In MRI systems, when several pairs of annular coils are placed face to face at positions which are symmetric on the Z axis, and electric currents of the same direction are supplied into those annular coils respectively, it is known that an axial component of a magnetic field B in a diagnostic space DS by those circular electric currents is given by the following series expansion accompanying even higher terms only.

$$B = B_0 + aZ^2 + bZ^4 + cZ^6 + \ldots$$

In the above series expansion, Bo represents a basic magnetic field contributing to the static magnetic field and a, b and c represent coefficients of high order variables $Z^2$, $Z^4$ and $Z^6$ which are all error terms. The higher the order of the variable Z becomes the smaller the coefficients are.

Figure 3:
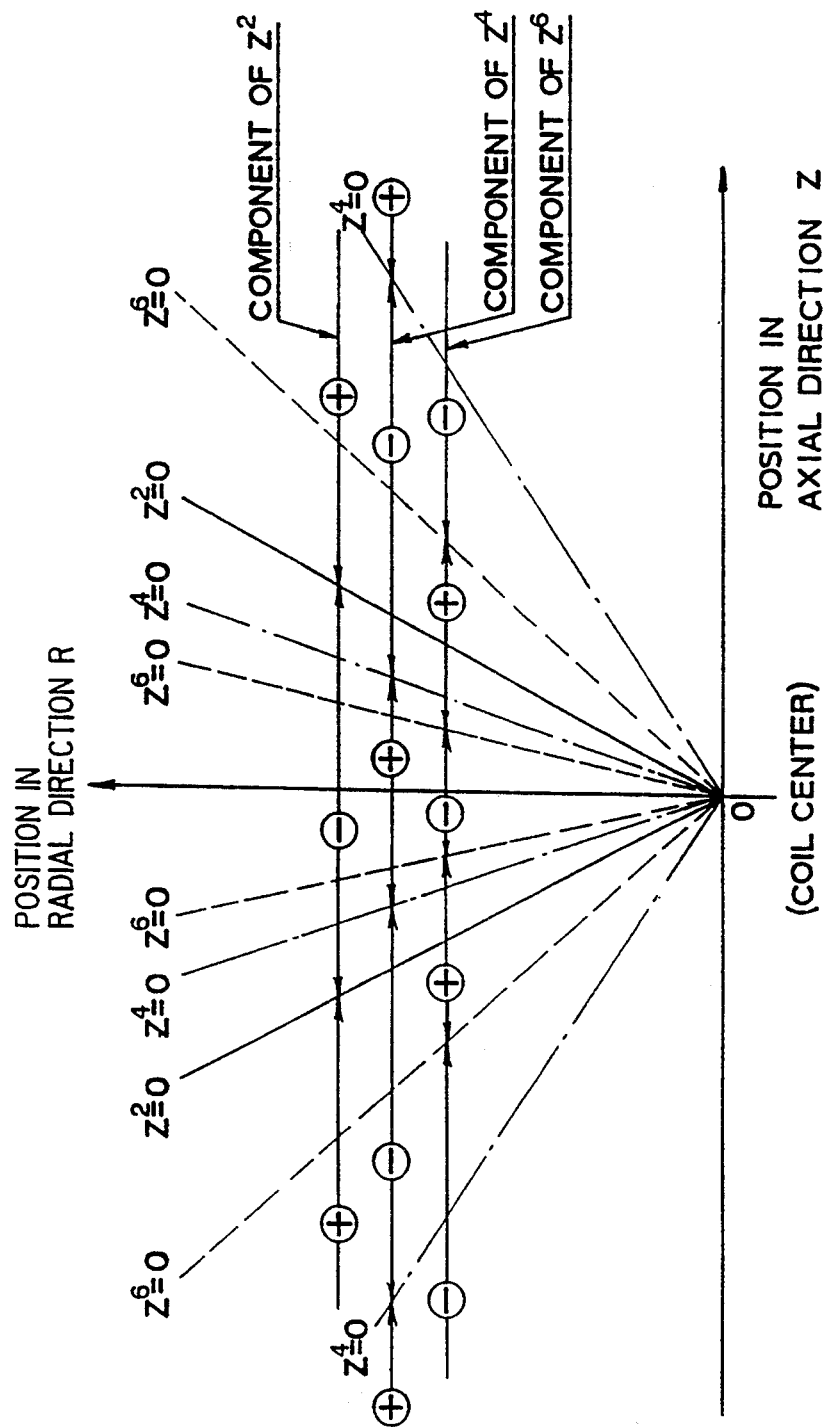
FIG. 3 is a graphical representation showing behavior of axial components, corresponding to error terms, of a static magnetic field.

The error terms $aZ^2$, $bZ^4$ and $cZ^6$ in the above series expansion can be shown schematically in a coordinate consisting of both Z axis and R axis representing the radius at Z=0, as shown in FIG. 3. Higher order terms having the eighth (8th) or more power are omitted in FIG. 3.

FIG. 3 shows that components of $Z^2$, $Z^4$ and $Z^6$ become zero at positions indicated by solid lines, respectively, one-dotted lines and dotted lines, thus their values are inverted between positive and negative over those lines expressed as boundaries.

Figure 4A:
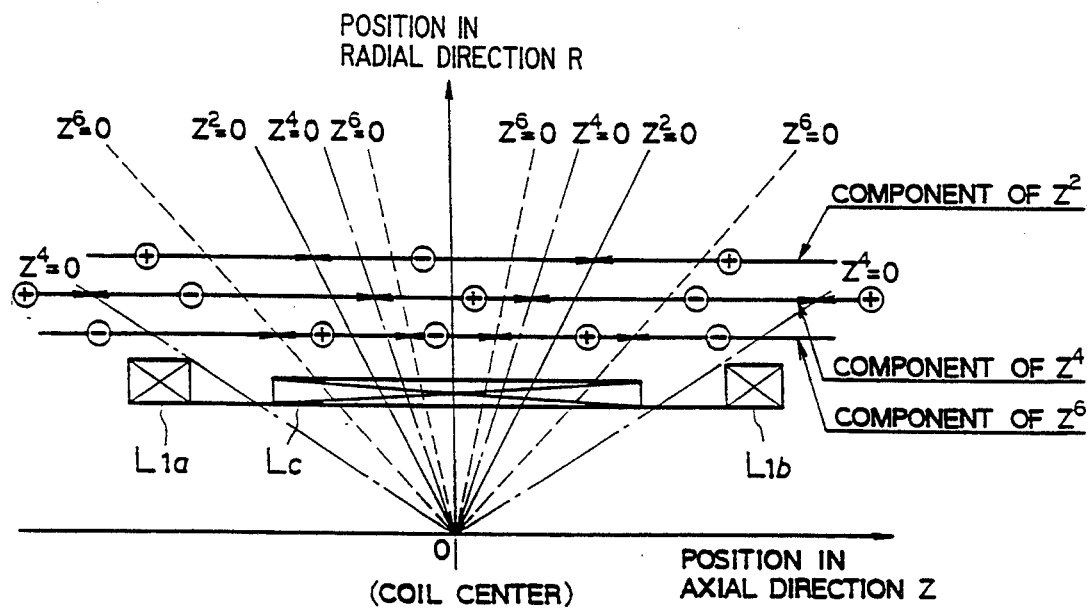
FIGS. 4A to 4C are graphical representations showing necessity of the sub-coil assembly.

Now, assume that a uniform magnetic field is maintained for a certain coil location shown in FIG. 4A. That is, the central main coil Lc almost reaches the one-dotted line boundary ($Z^4=0$) from the negative value region of $Z^4$, while the right-side main coil L1b exists in the positive value region of $Z^4$.

Figure 4B:
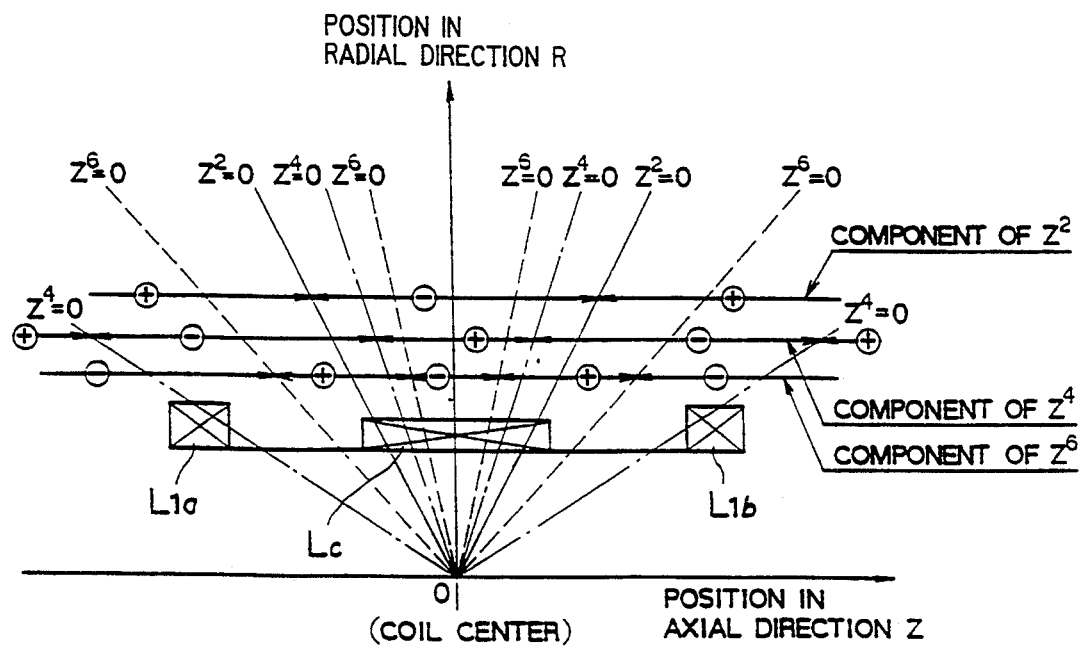

Then, it is assumed that, as shown in FIG. 4B, the main coil Lc is contracted in the axial direction (Z axis) and the main coil L1b is moved toward the axial center for reducing axial length of the whole magnet device 1. This reduction of the axial length causes an axial component of the magnetic field with respect to the $Z^4$ term to be more negative and less positive, with the result that a negative bias of the value would arise and the uniformity of the magnetic field would be deteriorated due to the imbalanced error term $Z^4$.

This same explanation can be applied to other error terms $Z^2$ and $Z^6$.

It is revealed that, from the above explanation, the relocation only of the main coils L1a, Lc and L1b can not achieve a reduced axial length and a high uniformity of magnetic field.

Figure 4C:
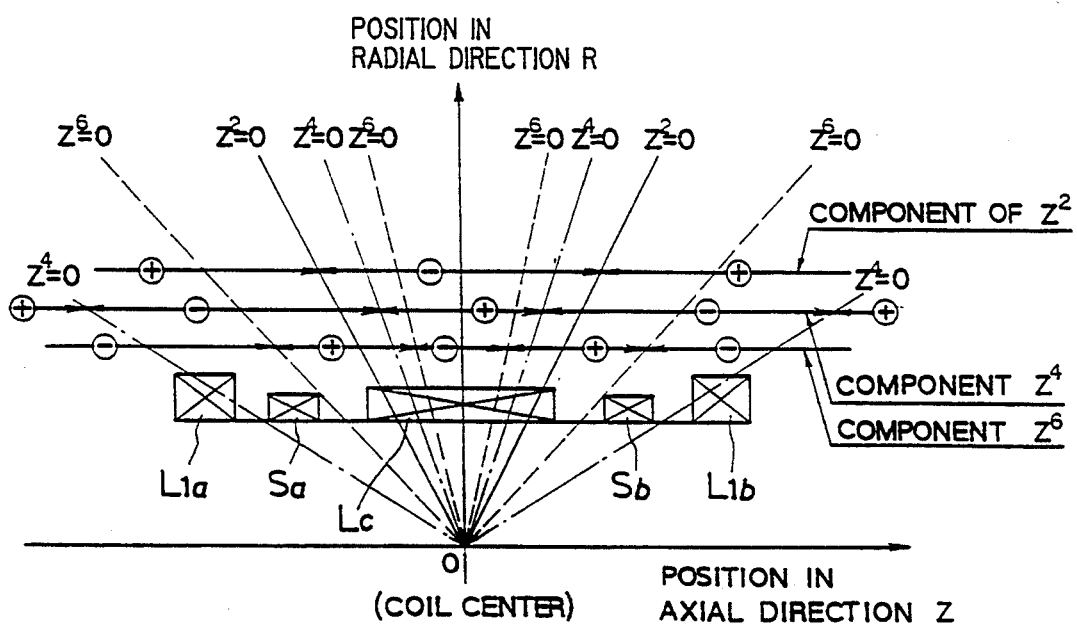

However, the sub-coils Sa and Sb are adopted in this embodiment according to the present invention. As shown in FIG. 4C, the sub-coils Sa and Sb are placed in the negative value region with regard to $Z^4$ between the main coils Lc and L1a, L1b. Since an electric current is given to the sub-coils Sa and Sb, in an opposite direction to that of the main coils L1a, Lc and L1b, the axial magnetic component of $Z^4$ produced by the sub-coils Sa and Sb may contribute to the positive value, with the result that predetermined cancellation of $Z^4$ term from a negative value to zero is carried out.

The axial positions of the sub-coils Sa and Sb are arranged so that the above cancellation properly works for $Z^2$ and $Z^6$ terms as well as $Z^4$ term. The whole error terms of $Z^2$, $Z^4$ and $Z^6$ can be negligible. Therefore when the axial length of the magnet device 10 is shortened, highly uniform magnetic field as the diagnostic space can be formed in the central part within the cylindrical bore 10a.

In addition to the shortened axial length, it is possible to reduce the radius of the device 1 because all the coils L1a, Lc, L1b, Sa and Sb are wound without overlap. This coil winding enables the entire device 1 to be compact. A separate cylindrical coil form is not necessary to be installed, so that the whole structure can be simplified a great deal.

Figure 5:
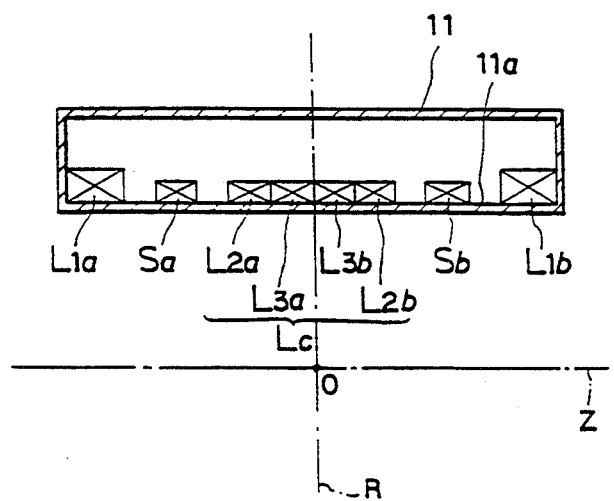
FIG. 5 is a partial sectional view representing a practical coil arrangement for the main coil assembly.

Practically, one of the main coils, Lc, which is positioned along the central part in the axial direction Z, is made up of four small-width coils L2a, L3a, L3b and L2b, as shown in FIG. 5.

Figures 6, 7:
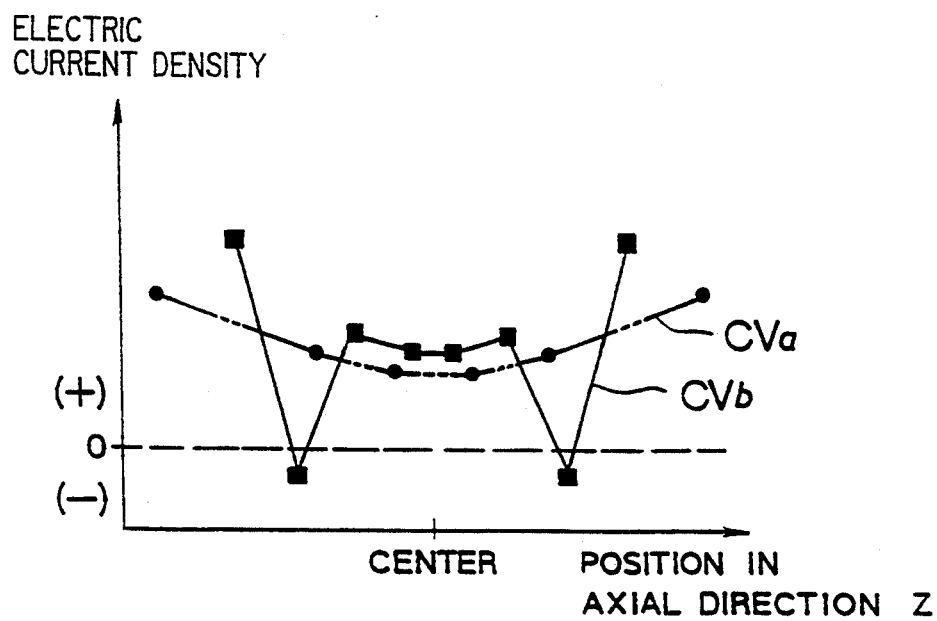
FIG. 6 is an illustration of pattern of current density distribution in the first embodiment.
FIG. 7 is a table showing levels of magnetomotive forces by the main and sub-coil assemblies.

For coil location shown in FIG. 5, an example of the current density distribution of the superconducting main coils L1a, L2a, L3a, L3b, L2b and L1b and sub-coils Sa and Sb is illustrated as a distribution curve CVb in FIG. 6.

Referring to FIG. 6, a distribution curve CVa shows a conventional magnet device which has a considerably large axial length. In that case, all the main coils are supplied with currents of positive (+) polarity. As seen from FIG. 6, for the conventional magnet, the current density is so determined that coils closer to both axial ends receive greater current density than coils near the axial center. Such current density distribution was intended for uniformalizing the magnetic field as the diagnostic space and expanding the uniform magnetic field, considering that the levels of the magnetic field decreases as the distance from the axial center increases in the diagnostic space.

In the present embodiment, however, the distribution curve CVb can be obtained for the coil location in which the axial length is reduced. It will be seen that the second points from both the end points on the distribution curve CVb, which correspond to the sub-coils Sa and Sb, are supplied with currents of negative (−) polarity, thus the sub-coils Sa and Sb being excited in reverse polarity. It is, therefore, possible to obtain a uniform high magnetic field intensity by the employing reverse excitation coils.

The distribution curves CVa and CVb here are based on calculations conducted on assumptions that the size of diagnostic space, as well as the error in the space, is unchanged.

Furthermore, FIG. 7 represents an example of magnetomotive forces of all the coils L1a, L2a, L3a, L3b, L2b, L1b, Sa and Sb according to the current density distribution in FIG. 6. The total magnetomotive force is 632 (KAT), while the central magnetic field is 0.35 (tesla). The magnetomotive force of the sub-coils Sa and Sb is 52.9 (KAT) which amounts to about 8.4% of the total magnetomotive force. Namely, the sub-coils Sa and Sb consume only a small fraction of the total electric energy supplied by the DC power supply 16, thus holding high strength of the magnetic field in the diagnostic space as well as being energy-saving. In addition, the strength of the magnetic field therein can be increased by supplying much current into the coils.

Figure 8:
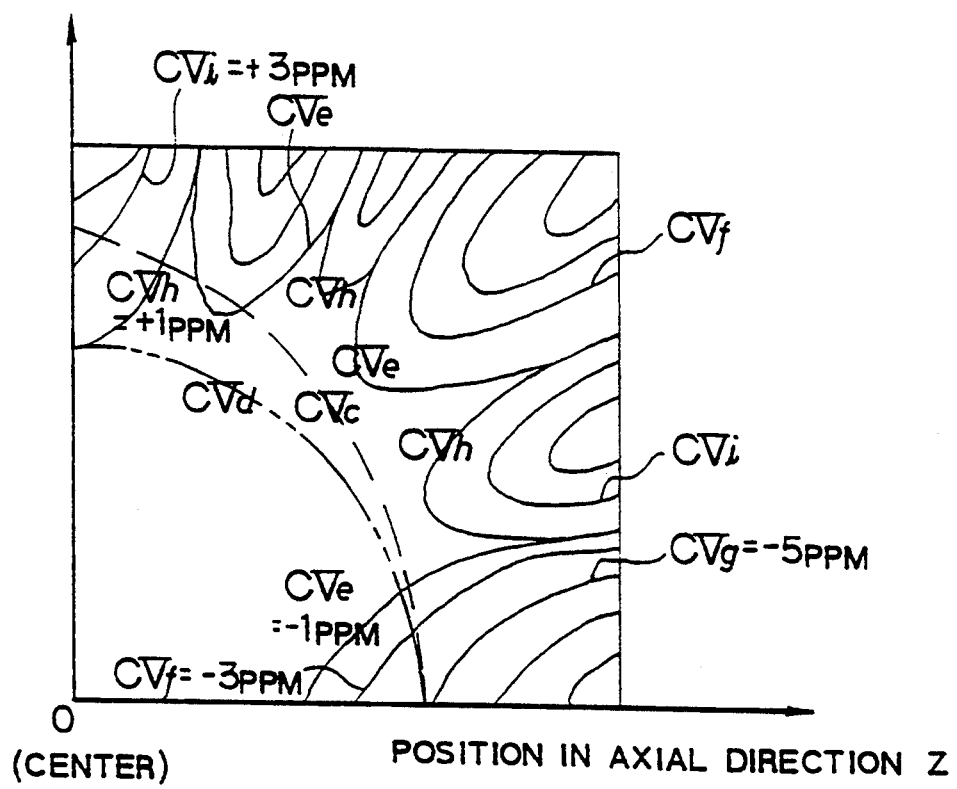
FIG. 8 is an illustration of a distribution pattern of equipotential field lines in and around a diagnostic space.

On the other hand, when the aforementioned coil location and magnetomotive forces are designated, an equipotential field distribution in and around the diagnostic space is found to be as shown in FIG. 8. Symbols CVe, CVf and CVg in FIG. 8, respectively, show levels of errors of $-1$ ppm, $-3$ ppm and $-5$ ppm with respect to the central magnetic field. Furthermore, symbols CVh and CVi in FIG. 8, respectively, show levels of errors of $+1$ ppm and $+3$ ppm. As a range of $-5$ ppm to $+5$ ppm may well be designated for uniformality of a diagnostic space, a partial distribution curve CVc can be drawn in FIG. 8. On the distribution curve CVc, since the error in the radial direction at the center ($Z=0$) is smaller than the error in the axial direction, it is possible to provide the ellipsoidal diagnostic space DS (refer to FIG. 1), which has a longer axis extending in the radial direction R than that in the axial direction Z. In FIG. 8, a partially-circular distribution curve CVd, which provides a conventional spherical diagnostic space, is imaginarily illustrated for reference.

It is thus possible to obtain a radially expanded space for the diagnostic space DS, whereby the ellipsoidal diagnostic space gives a patient relieved feeling from claustrophobia due to a small diagnostic space.

Figure 9:
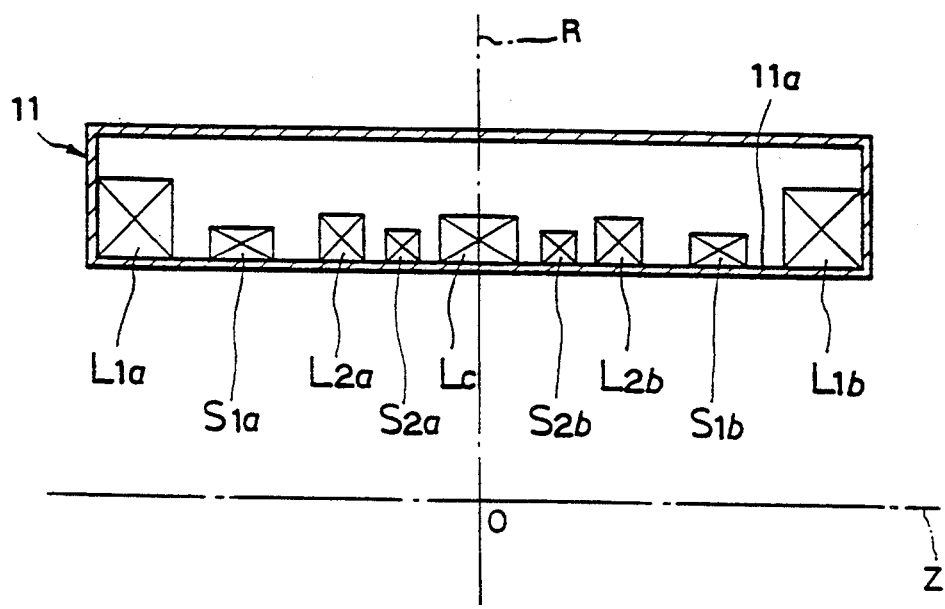
FIG. 9 is an axially-cut partial sectional view representing a further coil arrangement according to a second embodiment of the present invention.

FIG. 9 shows a schematic view of coil arrangement of a second embodiment of the present invention. According to structure in FIG. 9, there is provided a main coil assembly consisting of five main coils L1a, L2a, Lc, L2b and L1b and a sub-coil assembly consisting of four sub-coils S1a, S2a, S2b and S1b. The sub-coils S1a and S1b constitute one pair and the sub-coils S2a and S2b constitute one pair, thus two pairs in all. The main coils L1a, L2a, Lc, L2b and L1b and the sub-coils S1a, S2a, S2b and S1b are alternately wound, without overlap, along a liquid helium container 11. And that the sub-coils S1a, S2a, S2b and S1b are disposed so as to eliminate properly axial error components of a magnetic field produced by the main coils L1a, L2a, Lc, L2b and L1b by employing the same algorithm as that of the first embodiment.

As a result, the above superconducting magnet device of the second embodiment can operate similarly to that of the first embodiment. Particularly, two pairs of sub-coils facilitate higher accuracy, compared with one-pair sub-coil system, in eliminating the axial error components of the magnetic field.

In the aforementioned embodiments, the magnet devices have been each described as a superconducting magnet device. However, other magnet devices, such as a permanent magnet device and a normal conducting magnet device, are also applicable in the present invention. Furthermore, there may be provided two separate DC power units for the main coil assembly and sub-coil assembly, if those main coils and sub-coils are connected in series.

What we claim is:

1. A magnet device of a magnetic resonance imaging system which has a cylindrical space wherein a central point is determined in axial and radial directions of the cylindrical space and which generates a static magnetic field in the cylindrical space, the magnet device being a superconducting magnet device provided with a liquid helium container having an inner cylindrical wall portion, the magnet device comprising:

a reel means for forming the cylindrical space therein, the reel means being the inner cylindrical wall portion having a single-plate structure in the radial direction;

a main coil assembly including three or more ring-like main coils formed as superconducting coils within the liquid helium container and wound around and in contact with the inner cylindrical wall portion at axial positions of the inner cylindrical wall portion, the axial positions being symmetric with respect to the central point;

a sub-coil assembly including at least one pair of ring-like sub-coils formed as superconducting coils within the liquid helium container and wound around and in contact with the inner cylindrical wall portion at axially inner positions of the inner cylindrical wall portion with respect to axially outermost main coils of the main coils of the main coil assembly; and a coil driving means for providing the main coils with magnetomotive forces so as to cause the main coils to generate a main magnetic field along the axial direction and for providing the sub-coils with magnetomotive forces so as to cause the sub-coils to generate an inverse magnetic field having a direction opposite to the main magnetic field, the main magnetic field and inverse magnetic field being superimposed on each other to form a diagnostic space having a uniform static magnetic strength, wherein the sub-coils are disposed so as to generate the inverse magnetic field suppressing high order components in a series expansion of an axial component of the main magnetic field and the axial positions and magnetomotive forces of the main coils and sub-coils are adjusted so as to form the diagnostic space having an axis extending in the radial direction which is longer than an axis extending in the axial direction and having a cross-sectional ellipsoidal shape.

2. A magnet device as claimed in claim 1, wherein said main coil assembly comprises three main coils and said sub-coil assembly comprises a single pair of sub-coils.

3. A magnet device as claimed in claim 2, wherein said sub-coils are each disposed between axially outermost main coils and an axially central main coil of the main coil assembly.

4. A magnet device as claimed in claim 3, wherein all of said main coils and sub-coils are electrically connected in series, said sub-coils being wound oppositely to the main coils.

5. A magnet device as claimed in claim 4, wherein said coil driving means comprises a single electric power source electrically connected in series to all of the main coils and sub-coils.

6. A magnetic device as claimed in claim 1, where said main coil assembly comprises five main coils and said sub-coil assembly comprises two pairs of sub-coils.

7. A magnet device as claimed in claim 6, wherein one pair of said two pairs of sub-coils is disposed between axially outermost main coils and neighboring main coils positioned between the axially outermost main coils and an axially central main coil of the main coil assembly and the other pair of said two pairs of sub-coils is disposed between the neighboring main coils and the axially central main coil of the main coil assembly.

8. A magnet device as claimed in claim 7, wherein all of said main coils and sub-coils are electrically connected in series, the sub-coils being wound oppositely to the main coils.

9. A magnet device as claimed in claim 8, wherein said coil driving means comprises a single electric power source electrically connected in series to all of the main coils and sub-coils.

* * * * *